United States Patent
Takano

(10) Patent No.: US 6,605,523 B2
(45) Date of Patent: Aug. 12, 2003

(54) MANUFACTURING METHOD FOR SEMICONDUCTOR DEVICE

(75) Inventor: Michiyoshi Takano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/803,050

(22) Filed: Mar. 12, 2001

(65) Prior Publication Data

US 2001/0036685 A1 Nov. 1, 2001

(30) Foreign Application Priority Data

Mar. 10, 2000 (JP) ........................................ 2000-067390
Feb. 20, 2001 (JP) ........................................ 2001-043737

(51) Int. Cl.[7] ............................................... H01L 21/44
(52) U.S. Cl. ...................... 438/613; 438/106; 438/118; 438/464; 438/611; 438/612; 438/615
(58) Field of Search .................................. 438/106, 118, 438/464, 612, 613, 615, 611; 228/179.1

(56) References Cited

U.S. PATENT DOCUMENTS 5,059,559 A * 10/1991 Takahashi et al. .......... 228/105

FOREIGN PATENT DOCUMENTS

| JP | A-3-88344 | 4/1991 |
|---|---|---|
| JP | A-6-21158 | 1/1994 |
| JP | A-7-169789 | 7/1995 |
| JP | A-7-201927 | 8/1995 |
| JP | A-7-335691 | 12/1995 |
| JP | A-8-115950 | 5/1996 |

* cited by examiner

*Primary Examiner*—Matthew Smith
*Assistant Examiner*—Belur V. Keshavan
(74) *Attorney, Agent, or Firm*—Oliff & Berridge, PLC

(57) ABSTRACT

A semiconductor device and a manufacturing method thereof are provided, wherein both bumps of a semiconductor chip and leads on a tape substrate can be accurately connected at the time of performing thermocompression bonding of the two using a heating tool. The film tape carrier and semiconductor chip expand due to heat applied from the heating tool of the gang bonding apparatus, so setting the pitch of the bumps and the pitch of the inner leads, taking into consideration beforehand the difference in linear expansion coefficient of the two at the time of gang bonding, solves the problem.

12 Claims, 6 Drawing Sheets

| 1. TOOL SPEED (mm/SEC) | 1 | 3 | 5 | 10 | 15 |
|---|---|---|---|---|---|
| 2. TOOL SPEED DECELERATION POSITION (mm) | 0.5 | 0.5 | 0.5 | 0.5 | 0.5 |
| 3. PERCENTAGE OF STRETCHING OF TAPE CARRIER (POLYMIDE RESIN FILM) (%) | 0.07 | 0.041 | 0.03 | 0.018 | 0.01 |
| 4. DAMAGE TO IC | ○ | ○ | ○ | △ | × |
| 5. INNER LEAD CRACKS AND INNER LEAD DEFORMATIONS | × | △ | ○ | ○ | ○ |
| 6. OVERALL JUDGEMENT | × | ○ | ○ | × | × |

Fig. 3

MANUFACTURING METHOD FOR SEMICONDUCTOR DEVICE

BACKGROUND OF THE INVENTION

1. Field of Invention

The present invention relates to a method for manufacturing semiconductor devices, and particularly relates to mounting semiconductor chips on tape substrates.

2. Description of Related Art

In the field of semiconductor devices, TCP (Tape Carrier package) is well-known as a type of package with bear chips mounted. This involves a semiconductor chip being mounted on a film tape carrier 30 shown in FIG. 4. The film tape carrier 30 is normally formed by applying copper foil on a polyimide resin film, forming a circuit thereupon, and then applying Sn plating or Au plating, and is formed as a long article before being worked as a semiconductor device. Leads are formed of inner leads 20 connected to bumps formed of Au or the like on electrode pads on the semiconductor chip, and outer leads 36 formed integrally with the inner leads 20 and extended for external connections.

The following is a description of a TCP manufacturing method using gang bonding wherein all bumps and inner leads are simultaneously connected. First, on a stage not shown in the drawings, a semiconductor chip is positioned at a location surrounded by device holes 32, and positioning is performed so that each of the bumps on the semiconductor device and the inner leads to be connected thereto are properly connected. This positioning is performed using two of the bumps and inner leads on a diagonal line, out of the bumps and inner leads at the four corners. Next, as shown in FIG. 5(A), A heating tool 50 heated to around 500° C. beforehand is lowered to the positioned bumps of the semiconductor chip 40 and the inner leads 20. The heating tool 50 lowered on the inner leads 20 applies pressure so as to press the bumps and inner leads 20 against the stage.

Further, in the event that the bumps are formed of Au, for example, an Au/Sn eutectic alloy 46 shown in FIG. 5(B) is formed of the Sn plating of the inner leads 20 and the Au, due to the heat applied from the heating tool. Following connection of the bumps and the inner leads 20 by this eutectic alloy 46, a resin of epoxy or the like is applied by dropping or printing and then hardened (not shown) in order to avoid mechanical stress and ensure humidity resistance, thereby completing mounting of the semiconductor chip 40 onto the film tape carrier 30. After the semiconductor chip is mounted, the film tape carrier 30 is punched, thereby removing the unnecessary portions of the film tape carrier 30. The above steps complete the TCP.

SUMMARY OF THE INVENTION

In the event of connecting the bumps of the semiconductor chip and the inner leads using a heating tool as described above, there have been the following problems in actual practice.

That is, there is a difference between the linear expansions coefficients of the semiconductor chip and the film of the film tape carrier. As described above, the film of the film tape carrier is formed of polyimide, so the linear expansions coefficient of the film is greater, and the pitch of the inner leads becomes longer. Accordingly, in the event that the bumps and inner leads are formed with the same pitch at the stage before thermocompression bonding thereof with the heading tool, there will be difference in the pitch of these by the time that the heating tool comes into contact with the inner leads.

Accordingly, as shown in FIG. 6, even in the event that part of the bumps and inner leads are correctly connected as with the bump 10C and the inner lead 20C, there is positional shifting between the two at other places. In extreme cases, the shifting may be to the extent that proper connecting is difficult, as with the bump 10D and the inner lead 20D. This shifting occurs due to the heat of the heating tool as described above, and thus can be avoided by increasing the descending speed of the heating tool immediately before thermocompression bonding. However, increasing the descending speed of the heating tool leads to applying shock to the semiconductor chip which causes damage, thereby lowering the reliability of the manufactured semiconductor device.

Accordingly, it is an object of the present invention to provide a method for manufacturing a semiconductor device wherein both bumps of the semiconductor chip and leads on the tape substrate can be accurately connected at the time of performing thermocompression bonding of the two using a heating tool.

According to an exemplary embodiment of the present invention, a manufacturing method for a semiconductor device, wherein a semiconductor chip is mounted on a tape substrate, includes a step for causing leads formed on the tape substrate and bumps formed on an active face of the semiconductor chip to face one another; and a step for lowering a heating tool and bringing this into contact with the leads, and performing thermocompression bonding of the leads and the bumps.

In this exemplary embodiment, the lowering speed of the heating tool is changed up to coming into contact with the leads.

With this exemplary embodiment of the present invention thus configured, changing the lowering speed of the heating tool allows the time of contact between the leads and heating tool to be controlled, thereby suppressing stretching of the tape substrate due to heating to a minimum.

Also, with the above semiconductor device, the lowering speed of the heating tool has been made to decrease as the leads are approached.

With this exemplary embodiment of the present invention thus configured, the lowering speed of the heating tool is set to be relative to fast at first, thereby reducing the time of contact between the leads and the heating tool, so that stretching of the tape substrate due to heating can be suppressed to a minimum, and also the lowering speed of the heating tool has been made to decrease as the leads are approached, so as to not apply shock at the time of the leads coming into contact with the semiconductor chip to a degree of damaging the semiconductor chip.

Also, the speed of the heating tool may decrease to approximately 5 mm/second immediately before coming into contact with the leads.

Further, the heating tool is preferably lowered from above the leads at a speed of around 50 mm/second for example, and at the point of descending to a height of 0.1 to 0.5 mm from the leads, the subsequent descending speed is changed to around 5 mm/second.

Also, the tape substrate which is used may have the pitch of the leads set 0.01 to 0.03% shorter than the pitch of the bumps.

With this exemplary embodiment of the present invention thus configured, the difference in the linear expansions coefficients of the tape substrate and the semiconductor chip has been taken into consideration, in the event of using polyimide tape substrates in particular, and accordingly the pitch of the leads has been set 0.01 to 0.03% shorter than the pitch of the bumps, so the pitch of the leads and bumps can be made equal immediately prior to the thermocompression bonding.

Also, the temperature of the heating tool may be set to approximately 520° C., and thermocompression bonding of the bumps and the leads is performed.

With this exemplary embodiment of the present invention thus configured, the temperature of the heating tool is a temperature minimally necessary for suitably forming the eutectic alloy between the bumps and leads, thereby suppressing stretching of the tape substrate.

Also, according to another exemplary embodiment of the present invention, a semiconductor device manufacturing method for bonding a tape substrate, upon which leads are formed, and a semiconductor chip, upon which bumps are formed, on an active face thereof includes at least a step for preparing the tape substrate such that the pitch width of the leads has been set beforehand so as to be equal to a value obtained by multiplying the pitch of the bumps by the ratio of the linear expansion coefficient of the semiconductor chip as to the linear expansion coefficient of the tape substrate at the heating temperature of thermocompression bonding of the bumps and the leads; a step for positioning at least one reference bump of the arrayed bumps and a reference lead to correspond to the reference bump such that the center lines of the reference bump and the reference lead overlap, and also for positioning each of the leads so as to face respective the bumps; and a step for lowering a heating tool from above the leads and bringing this into contact with the leads, and performing thermocompression bonding of the leads and the bumps.

Also, according to another exemplary embodiment of the present invention, a semiconductor device manufacturing method for bonding a tape substrate, upon which leads are formed, and a semiconductor chip, upon which bumps are formed, on an active face thereof includes a step for preparing the tape substrate such that the pitch width of the leads has been set beforehand so as to be equal to a value obtained by multiplying the pitch of the bumps by the ratio of the linear expansion coefficient of the semiconductor chip as to the linear expansion coefficient of the tape substrate at the heating temperature of thermocompression bonding of the bumps and the leads; a step for positioning at least one reference bump of the arrayed bumps and a reference lead to correspond to the reference bump such that the center lines of the reference bump and the reference lead overlap, and also for positioning each of the leads so as to face respective the bumps; and a step for lowering a heating tool from above the leads and bringing this into contact with the leads, and performing thermocompression bonding of the leads and the bumps.

According to this exemplary embodiment, the lowering speed of the heating tool changes as the leads are approached.

With this exemplary embodiment of the present invention thus configured, the thermal expansion between the tape substrate and semiconductor chip at the time of thermocompression bonding of the leads and the bumps has been taken into consideration beforehand for the pitch of the leads, so the pitch of the leads and bumps can be made equal immediately prior to the thermocompression bonding. Thus, the bumps and leads can be connected properly. Also, positioning of the tape substrate and semiconductor chip is performed such that the center lines of a reference bump situated at approximately the center of a row of bumps and a reference lead situated at approximately the center of a row of leads overlap, so at the time of lowering the heating tool from above the leads and bringing it close to the bumps and leads, even in the event that unexpected shifting of pitch occurs between these, the shifting of the bumps at the end of the bump row and the leads at the end of the lead row which are situated farthest from the reference bump and reference lead, can be minimized.

Also, changing the lowering speed of said heating tool may allow the contact time between the leads and heating tool to be controlled, thereby suppressing stretching of the tape substrate due to heating to a minimum.

BRIEF DESCRIPTION OF THE DRAWINGS

FIGS. 1(A)–(B) are explanatory diagrams of a semiconductor device according to an exemplary embodiment of the present invention, wherein FIG. 1(A) is an explanatory diagram illustrating the relation between the pitch of bumps on a semiconductor chip and the pitch of leads on a film tape carrier before mounting the semiconductor chip, and FIG. 1(B) is an explanatory diagram illustrating the relation between the pitch of bumps on the semiconductor chip and the pitch of inner leads on the film tape carrier after mounting the semiconductor chip;

FIG. 3 is an explanatory diagram illustrating the relation between the descending speed of the heating tool and stretching percentage of the film of the film tape carrier, and damage to the semiconductor chip and inner leads;

FIGS. 5(A)–(B) are explanatory diagrams illustrating the thermocompression bonding method of the bumps of the semiconductor chip to the inner leads of the film tape carrier, wherein FIG. 5(A) is an explanatory diagram illustrating the state of the bumps and inner leads before thermocompression bonding, and FIG. 5(B) is an explanatory diagram illustrating the state of the bumps and inner leads following thermocompression bonding.

DETAILED DESCRIPTION OF PREFERRED EMBODIMENTS

The following is a detailed description of suitable exemplary embodiments of the semiconductor device according to the present invention, and the manufacturing method thereof, with reference to the attached drawings. Note that parts corresponding to parts described with the above-described related art are denoted by the same symbols and description thereof is omitted. Also, those with the same contents as those described with the related art will be described in brief.

Figure 1A:
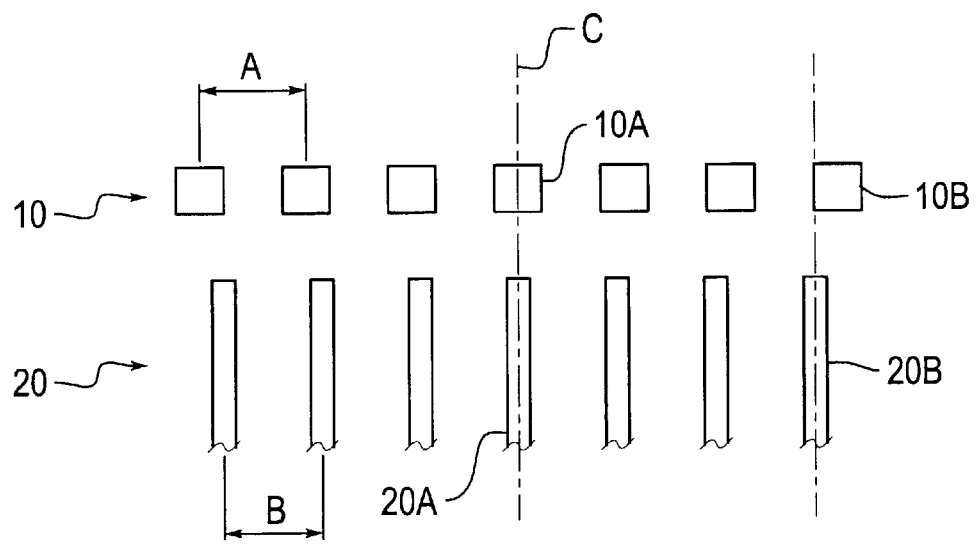
Figure 1B:
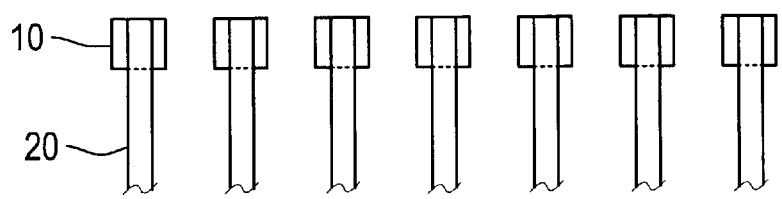
Figure 2:
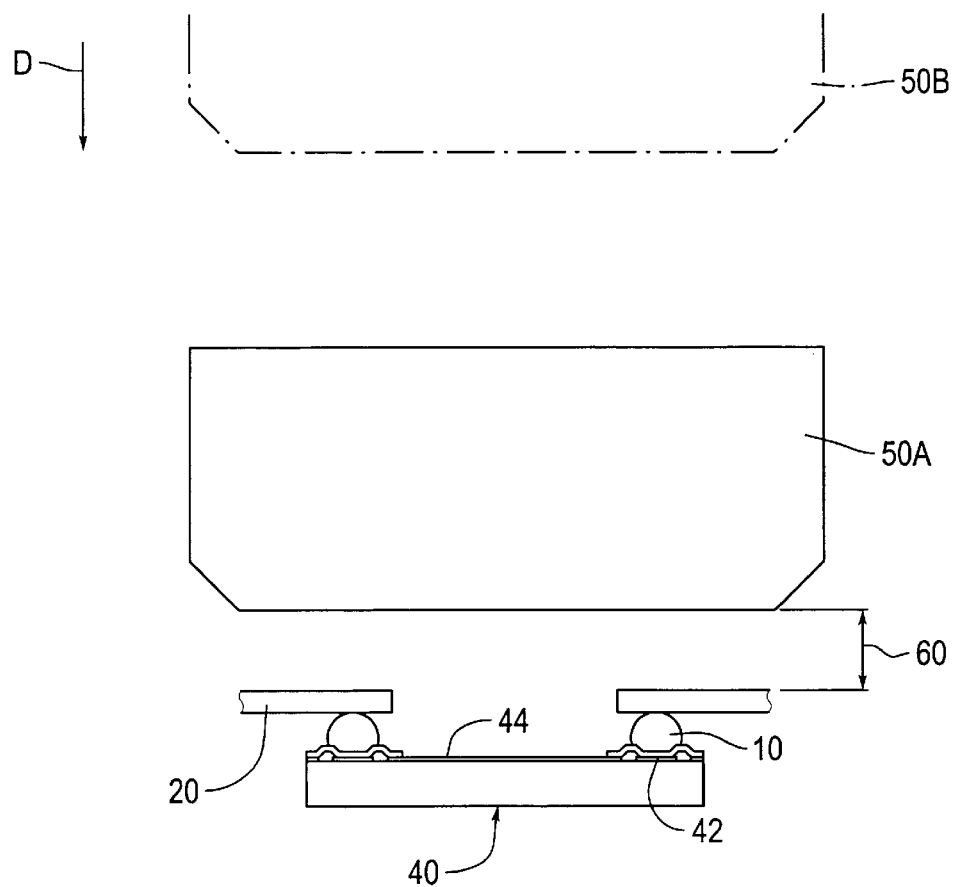
FIG. 2 is an explanatory diagram of the method for manufacturing the semiconductor device according to an embodiment of the present invention.
Figure 4:
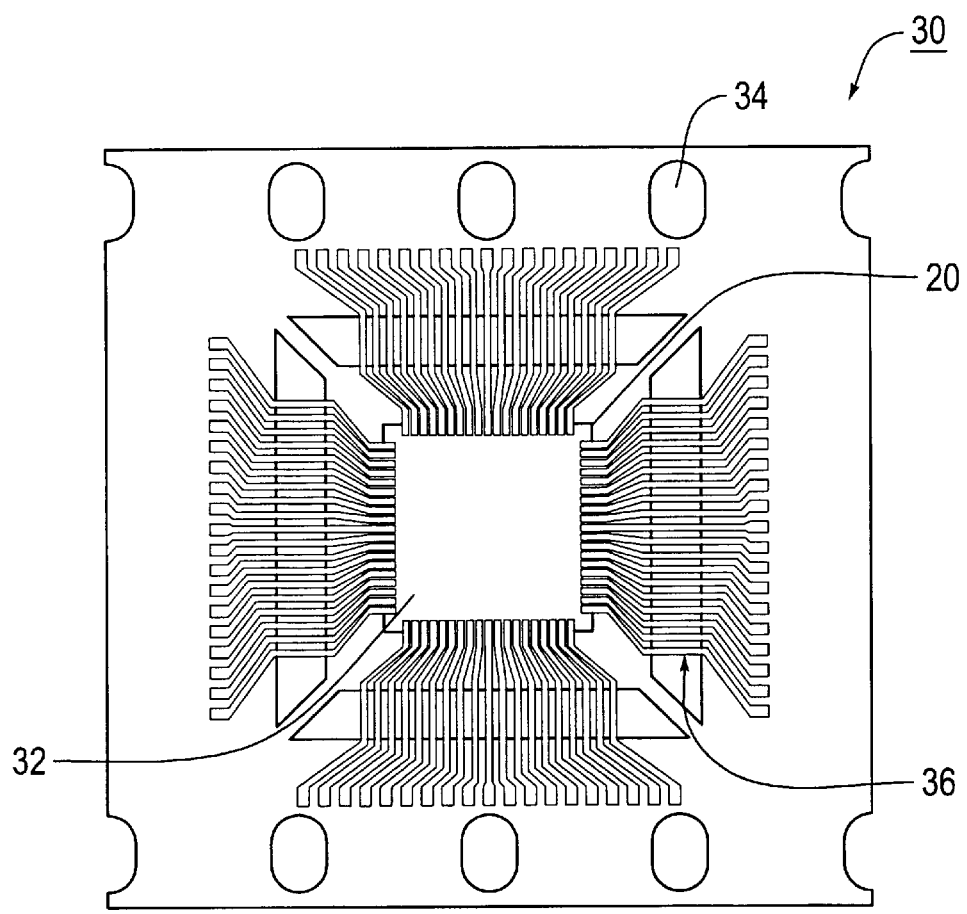
FIG. 4 is an explanatory diagram of the film tape carrier.
Figure 5A:
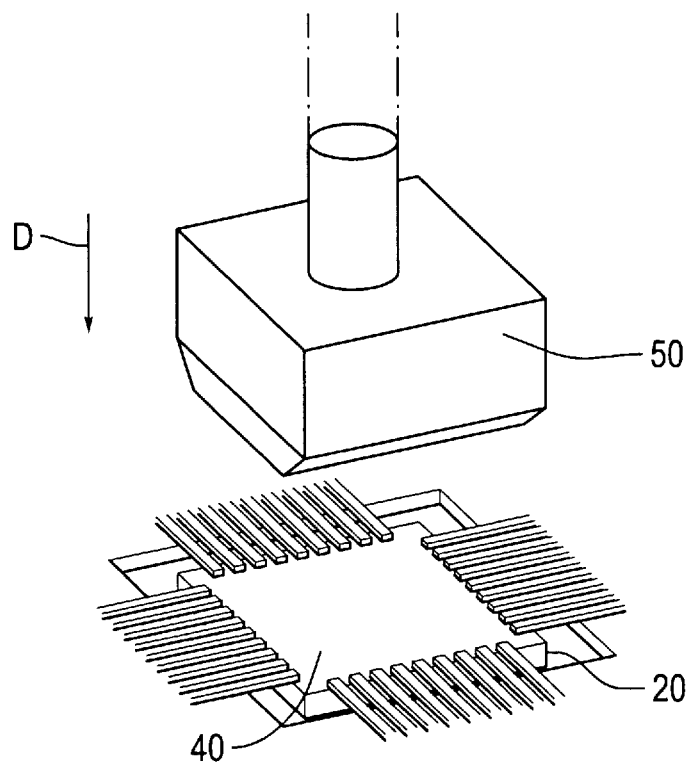
Figure 5B:
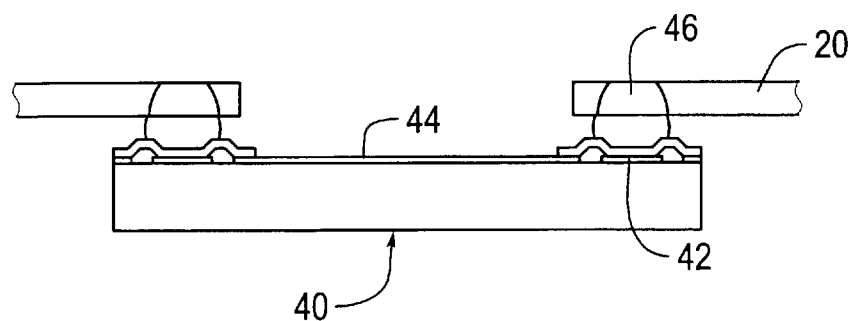
Figure 6:
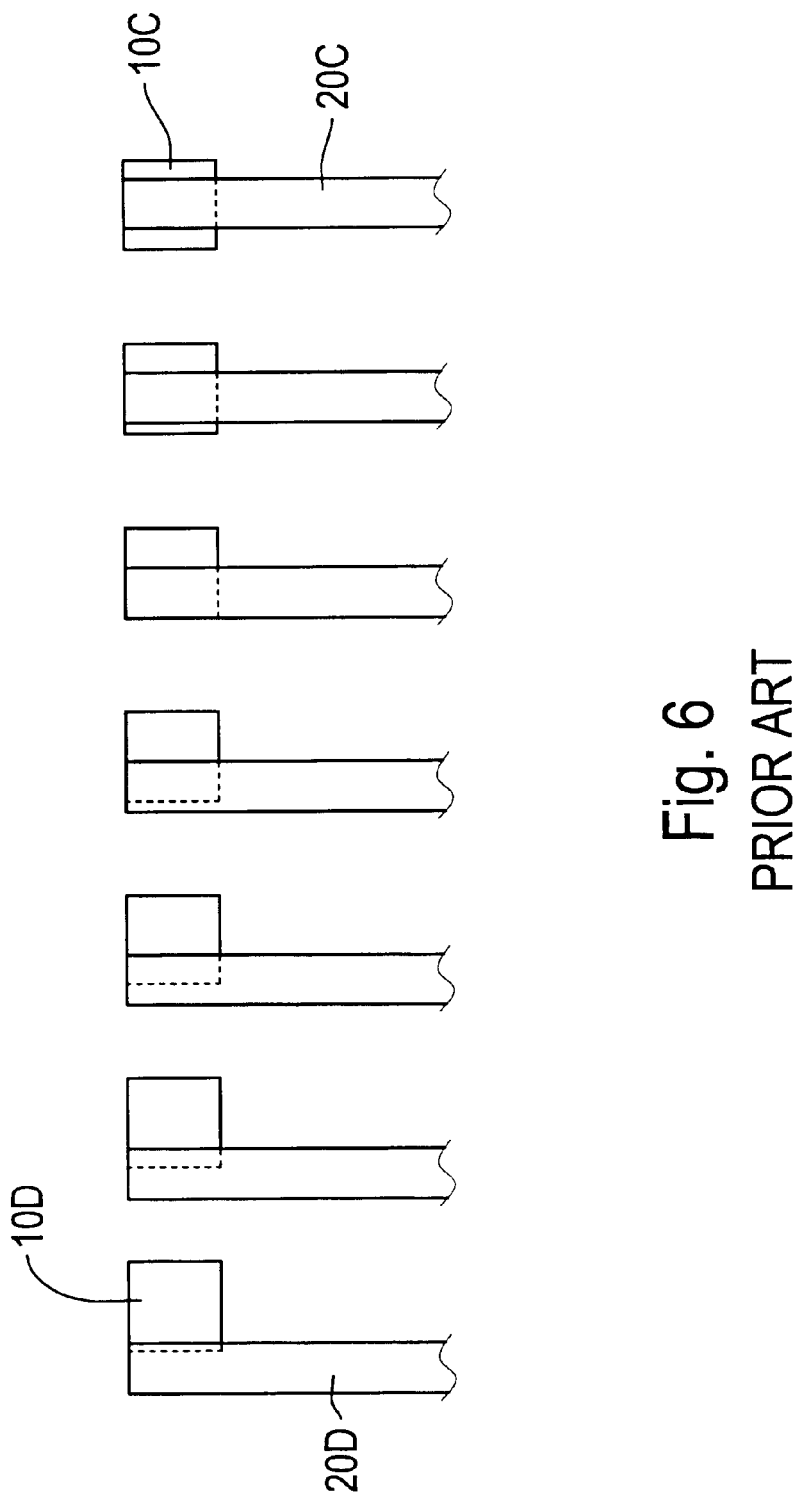
FIG. 6 is an explanatory diagram illustrating the relation between the pitch of bumps on the semiconductor chip and the pitch of leads on the film tape carrier after mounting the semiconductor chip, in the case of using a related art.

FIGS. 1(A)–(B) are explanatory diagrams of a semiconductor device according to the present invention, wherein FIG. 1(A) is an explanatory diagram illustrating the relation between the pitch of bumps on a semiconductor chip before mounting the semiconductor chip, and the pitch of leads on a film tape carrier, and FIG. 1(B) is an explanatory diagram illustrating the relation between the pitch of bumps on the semiconductor chip after mounting the semiconductor chip, and the inner leads on the film tape carrier. Also, FIG. 2 is an explanatory diagram of the method for manufacturing the semiconductor device according to an embodiment of the present invention. Also, FIG. 3 is an explanatory diagram illustrating the relation between the descending speed of the heating tool and stretching percentage of the film of the film tape carrier, and damage to the semiconductor chip and inner leads.

With this embodiment of the present invention, the difference in linear expansion coefficients between the film tape carrier and semiconductor chip at the time of thermocompression bonding has been taken into consideration beforehand for setting the pitch of the leads, noting that the film tape carrier and semiconductor chip expand from the heat applied from the heating tool of the gang bonding apparatus at the time of performing thermocompression bonding, and that the difference in linear expansion coefficients between the two has undesirable effects on the connection between the inner leads and the bumps.

As shown in FIG. 1(A), immediately before the thermocompression bonding of the inner leads and bumps, the pitch A of the bumps 10 and the pitch B of the inner leads 20 are made to be different. This difference between the pitch A and the pitch B is the result of making settings taking consideration beforehand of the difference in linear expansion coefficients of the film tape carrier and semiconductor chip at the time of thermocompression bonding of the inner leads and bumps, as described above.

The film of the film tape carrier is formed of a polyimide resin, and the inner leads and outer lead are formed of Sn plated on copper foil. Also, the bumps of the semiconductor chip are formed of Au. The film tape carrier and the semiconductor chip are placed on a stage not shown in the drawings. This stage is heated to approximately 100° C., but this has almost no effect on the linear expansion coefficients of the film tape carrier and semiconductor chip.

Also, the temperature of the heating tool at the time of performing thermocompression bonding of the inner leads and bumps is set to around 500° C. The difference in linear expansion coefficients between the two at this temperature is 0.01 to 0.03%, with the linear expansion coefficient of the film tape carrier being somewhat greater. Note that the linear expansion coefficient of polyimide resin is 12 to 20 ($\times 10^{-6}$ cm/cm/° C.).

Accordingly, setting the pitch B so as to be 0.01 to 0.03% smaller than the pitch A before the thermocompression bonding of the inner leads and bumps beforehand makes the pitch A and pitch B to be the same under the heat of the heating tool immediately before thermocompression bonding, as shown in FIG. 1(B). Accordingly, defects in connection between the inner leads and bumps due to the heat applied from the heating tool can be prevented according to this embodiment of the present invention.

Also, in addition to the method described above, wherein the pitch A and pitch B of the inner leads and bumps are adjusted beforehand, the following methods are also preferably employed at the same time.

First, at the time of positioning so that the bumps of the semiconductor chip and the inner leads to be connected to each of the bumps will be connected properly, a bump and an inner lead situated at the center of the bump rows and inner lead rows set as reference bump 10A and reference inner lead 20A, respectively, as shown in FIG. 1(A). Then, the semiconductor chip and the film tape carrier are positioned such that the center line of the reference bump 10A and the center line of the reference inner lead 20A agree with a center line C.

As described above, there is difference provided in the pitch of the inner leads and bumps before the thermocompression bonding thereof. According, as can be understood from FIG. 1(A), the greater the distance is from the bump and inner lead serving as the references for positioning, the more this difference is accumulated, and the shift between the center lines of the inner leads and the bumps increases. Accordingly, positioning as described above allows the distance between the bumps and inner leads serving as positioning references and the bumps and inner leads situated at the ends to be minimized, and consequently allows the positional shifting between the bump 10B at the end and the inner lead 20B at the end immediately before the thermocompression bonding of the inner leads and bumps.

Accordingly, at the time of thermocompression bonding of the inner leads and bumps, even in the event that connection happens to be made without the pitch A and the pitch B completely agreeing, the probability of connection defects occurring between the bump 10B at the end and the inner lead 20B at the end can be reduced. Incidentally, the reference bump and reference inner lead need not be situated at the center, rather those near the center may be used as necessary.

The steps described next alone function sufficiently to solve the problems, but combining with the above-described steps yield even greater effects. Accordingly, with the present embodiment, the following steps are performed following the above steps.

Next, as shown in FIG. 2, at the stage of having finished positioning the bumps 10 and inner leads 20, a position at a height 0.5 mm from the inner leads 20 is set as a deceleration position 60. Then, at the time of performing thermocompression bonding of the bumps 10 and inner leads 20, the heating tool 50B which has the head thereof raised above the inner leads 20 is lowered at a high speed, 50 mm/second for example, as indicated by the arrow D. Then, as indicated by the heating tool 50A, once descended to the deceleration position 60 from the inner leads 20, the lowering speed is changed to approximately 5 mm/second.

Thus, the heating tool 50B is lowered at high speed to a position very near the inner leads 20, so the time that unnecessary heat which does not contribute to connecting is applied from the heating tool to the semiconductor chip and the film tape carrier, can be reduced. In addition, the deceleration position 60 is set at a height of approximately 0.5 mm, so even in the event that the operating precision of the heating tool is not very high, collision of the heating tool against the inner leads 20 and resulting damage to the semiconductor chip can be avoided.

Further, after the heating tool 50A is further lowered from the deceleration position 60 until coming into contact with the inner leads 20, the descent is at the maximum speed which will not subject the semiconductor chip to shock, so the time that unnecessary heat which does not contribute to connecting is applied from the heating tool to the semiconductor chip and the film tape carrier can be reduced even further.

Also, the lowering speed of the heating tool 50B may be made to be higher speeds such as 100 mm/second for example, as long as collision of the heating tool into the inner leads can be avoided. Also, in the event that the operating precision of the heating tool is sufficiently high, the deceleration position 60 may be set even closer to the inner leads 20, such as 0.1 mm in height, for example.

Incidentally, in the above-described embodiment, the temperature of the heating tool is preferably set to 520° C.

520° C. is a temperature most suitable for forming the eutectic alloy between the bumps and leads while compensating for the irregularities in the thickness of the Sn plated on the leads, without damaging the leads and semiconductor chip following gang bonding, and setting the temperature thus the stretching of the film tape carrier can be kept to a minimum while securing good connections between the bumps and leads. Further, regarding the temperature of the heating tool, setting to a range of 480 to 540° C. yields effects accordingly.

With regard to the above embodiment, the Inventor has performed experiments regarding the relation between the descending speed of the heating tool and the stretching percentage of the film of the film tape carrier, and damage to the semiconductor chip and inner lead, and has obtained data confirming the effects thereof, so the results thereof will be described below with reference to FIG. 3. Also, the temperature of the heating tool for this experiment was set to 520° C. which is most suitable for forming the eutectic alloy between the bumps and leads, the temperature of the stage on which the semiconductor chip is placed was set to 100° C., and the bonding time was set at 0.7 seconds.

Item 1 in the table shown in FIG. 3 represents the descending speed of the heating tool after reaching the deceleration position, i.e., the speed of coming into contact with the inner leads. Item 2 indicates the above-described deceleration position 60, which was set to 0.5 mm for all. Item 3 indicates the stretching percentage of the film tape carrier. Item 4 indicates the state of damage to the semiconductor chip under the conditions of 1 through 3, wherein a circle implies that there was no damage, a triangle implies that there was damage, and an X implies that there was fatal damage. Item 5 indicates the state of damage of inner leads such as cracking and deformations, wherein a circle implies that there was no damage, a triangle implies that there was damage, and an X implies that there was fatal damage. Moreover, item 6 represents overall judgment results, wherein a circle represents results implying that reliability as a semiconductor device can be secured, and an X represents results implying that reliability as a semiconductor device cannot be secured.

As can be understood from FIG. 3, the results of the experiment show that employable descending speeds for the heating tool is 3 or 5 mm/second. Looking more closely at item 3, the stretching percentage of the film tape carrier is smaller at descending speed of 5 mm/second. Stretching of the film tape carrier greatly affects the accuracy of connection of the bumps and inner leads as described above, and accordingly is preferably suppressed as much as possible. Also, though the tool speed of 3 mm/second in item 5 is judged with a triangle, occurrences of minute cracks of a level which would not affect reliability are observed. Accordingly, it can be understood that the optimal descending speed for the heating tool is 5 mm/second.

As described above, with the semiconductor device according to this embodiment of the present invention and the manufacturing method thereof, the pitch of the inner leads of the film tape carrier is set as described above, and the descending speed of the heating tool is set as described above at the gang bonding device, thereby allowing solving, so the problems can be solved without making great changes to already-existing manufacturing devices and methods.

As described above, according to the present invention, with a semiconductor device having at least a tape substrate upon which leads are formed, and a semiconductor chip which is mounted on the tape substrate by thermocompression bonding of bumps formed on the active face thereof to the leads, the pitch of the leads is configured to be formed to a value equal to the pitch of the bumps multiplied by a ratio of the linear expansion coefficient of the semiconductor chip as to the linear expansion coefficient of the tape substrate at the heating temperature at the time of performing thermocompression bonding of the bumps and the leads, so reliability of the connection of the semiconductor chip and tape substrate can be greatly improved with simple means. Further, the manufacturing cost of the semiconductor device can be reduced.

Further, changing the descending speed of the heating tool allows the contact time between the leads and the heating tool to be controlled, thereby suppressing the stretching of the tape substrate due to heating to a minimum. Also, decelerating the descending speed of the heating tool immediately before the lead and the semiconductor chip coming into contact avoids damage to the semiconductor chip due to shock at the time of the lead and the semiconductor chip coming into contact.

What is claimed is:

1. A manufacturing method for a semiconductor device wherein a semiconductor chip is mounted on a tape substrate, said tape substrate including a lead row composed of leads and said semiconductor chip including a bump row composed of bumps, said method comprising the steps of:

causing said leads formed on said tape substrate and said bumps formed on an active face of said semiconductor chip to face one another, a pitch width of adjacent two bumps of said bumps is greater than a pitch width of adjacent two leads of said leads corresponding to said adjacent two bumps, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also for positioning each of said leads so as to respectively face said bumps; and lowering a heating tool and bringing the heating tool into contact with said leads, and performing thermocompression bonding of said leads and said bumps, a lowering speed of said heating tool being changed up to coming into contact with said leads.

2. The manufacturing method for a semiconductor device according to claim 1, the lowering speed of said heating tool decreasing as said leads are approached.

3. The manufacturing method for a semiconductor device according to claim 2, the lowering speed of said heating tool decreasing to approximately 5 mm/second immediately before coming into contact with said leads.

4. The manufacturing method for a semiconductor device according to claim 1, said tape substrate which is used having a pitch of said leads set 0.01 to 0.03% shorter than a pitch of said bumps.

5. The manufacturing method for a semiconductor device according to claim 1, said heating tool having a temperature set to 520° C., and thermocompression bonding of said bumps and said leads being performed.

6. A semiconductor device manufacturing method for bonding a tape substrate upon which leads are formed and a semiconductor chip upon which bumps are formed on an active face thereof, said method comprising the steps of:

preparing said tape substrate including a lead row composed of said leads and said semiconductor chip including a bump row composed of said bumps, a pitch width of said leads has been set beforehand so as to be equal to a value obtained by multiplying a pitch of said bumps by a ratio of a linear expansion coefficient of said semiconductor chip as to a linear expansion coefficient of said tape substrate at a heating temperature of thermocompression bonding of said bumps and said leads, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also for positioning each of said leads so as to respectively face said bumps; and lowering a heating tool from above said leads and bringing the heating tool into contact with said leads, and performing thermocompression bonding of said leads and said bumps.

7. A semiconductor device manufacturing method for bonding a tape substrate upon which leads are formed and a semiconductor chip upon which bumps are formed on an active face thereof, said method comprising the steps of:

preparing said tape substrate including a lead row composed of said leads and said semiconductor chip including a bump row composed of said bumps, a pitch width of said leads has been set beforehand so as to be equal to a value obtained by multiplying a pitch of said bumps by a ratio of said linear expansion coefficient of said semiconductor chip as to a linear expansion coefficient of said tape substrate at a heating temperature of thermocompression bonding of said bumps and said leads, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also for positioning each of said leads so as to respectively face said bumps; and lowering a heating tool from above said leads and bringing the heating tool into contact with said leads, and performing thermocompression bonding of said leads and said bumps, a lowering speed of said heating tool changing as said leads are approached.

8. A manufacturing method for a semiconductor device wherein a semiconductor chip is mounted on a tape substrate, said tape substrate including a lead row composed of leads and said semiconductor chip including a bump row composed of bumps, said method comprising the steps of:

causing said leads formed on said tape substrate and said bumps formed on an active face of said semiconductor chip to face one another, a pitch width of said leads having been set beforehand so as to be equal to a value obtained by multiplying a pitch of said bumps by a ratio of a linear expansion coefficient of said semiconductor chip as to a linear expansion coefficient of said tape substrate at a heating temperature of thermocompression bonding of said bumps and said lead, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also for positioning each of said leads so as to respectively face said bumps; and lowering a heating tool and bringing the heating tool into contact with said leads, and performing thermocompression bonding of said leads and said bumps, a lowering speed of the heating tool being changed up to coming into contact with said leads.

9. A semiconductor device manufacturing method for bonding a tape substrate upon which leads are formed and a semiconductor chip upon which bumps are formed on an active face thereof, said method comprising the steps of:

preparing said tape substrate including a lead row composed of said leads and said semiconductor chip including a bump row composed of said bumps, a pitch width of adjacent two bumps of said bumps are greater than a pitch width of adjacent two leads of said leads, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also positioning each of said leads so as to respectively face said bumps; and lowering a heating tool from above said leads and bringing the heating tool into contact with said leads, and performing thermocompression bonding of said leads and said bumps.

10. A semiconductor device manufacturing method for bonding a tape substrate upon which leads are formed and a semiconductor chip upon which bumps are formed on an active surface thereof, said method comprising the steps of:

preparing said tape substrate including a lead row composed of said leads and said semiconductor chip including a bump row composed of said bumps, a pitch width of adjacent two bumps of said bumps are greater than a pitch width of adjacent two leads of said leads, said bump row including at least one reference bump which is located at the center of said bump row, and said lead row including at least one reference lead which is located at the center of said lead row and corresponds to said reference bump;

positioning said reference bump and said reference lead such that center lines of said reference bump and said reference lead overlap, and also for positioning each of said leads so as to respectively face said bumps; and lowering a heating tool from above said leads and bringing the heating tool into contact with said leads, and performing thermocompression bonding of said leads and said bumps, a lowering speed of said heating tool changing as said leads are approached.

11. A semiconductor device manufacturing method for bonding a tape substrate upon which leads are formed and a semiconductor chip upon which bumps are formed on an active face thereof, said method comprising the steps of:

preparing said tape substrate including a lead row composed of said leads and said semiconductor chip including a bump row composed of said bumps, a pitch width of said leads has been set beforehand so as to be equal to a value obtained by multiplying a pitch of said bumps by a ratio of linear expansion coefficient and said semiconductor chip as to a linear expansion coefficient of said tape substrate at a heating temperature of thermocompression bonding of said bumps and said leads, said bump row including at least one reference bump which is located near the center of said bump row, and said lead row including at least one reference lead which is located near the center of said lead row and corresponds to said reference bump;

positioning said reference bump and said reference lead such that center lines of said reference bump and said reference lead overlap, and also positioning each of said leads so as to respectively face said bumps; and lowering a heating tool from above said leads and bringing the heating tool into contact with said leads, and performing thermocompression bonding of said leads and said bumps.

12. A semiconductor device manufacturing method for bonding a tape substrate upon which leads are formed and a semiconductor chip upon which bumps are formed on an active face thereof, said method comprising the steps of:

preparing said tape substrate including a lead row composed of said leads and said semiconductor chip including a bump row composed of said bumps, a pitch width of adjacent two bumps of said bumps are greater than a pitch width of adjacent two leads of said leads, said bump row including at least one reference bump which is located near the center of said bump row, and said lead row including at least one reference lead which is located near the center of said lead row corresponding to said reference bump;

positioning said reference bump and said reference lead such that center lines of said reference bump and said reference lead overlap, and also positioning each of said leads so as to respectively face said bumps; and lowering a heating tool from above said leads and bringing the heating tool into contact with said leads, and performing thermocompression bonding on said leads and said bumps.

* * * * *